United States Patent
Kudoh

(10) Patent No.: US 9,531,975 B2
(45) Date of Patent: Dec. 27, 2016

(54) SOLID-STATE IMAGING DEVICE AND CAMERA

(71) Applicant: Sony Corporation, Tokyo (JP)

(72) Inventor: Yoshiharu Kudoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/754,334

(22) Filed: Jun. 29, 2015

(65) Prior Publication Data

US 2015/0318324 A1 Nov. 5, 2015

Related U.S. Application Data

(60) Continuation of application No. 14/490,345, filed on Sep. 18, 2014, which is a division of application No. 13/721,915, filed on Dec. 20, 2012, now Pat. No. 9,160,955, which is a continuation of application No. 12/275,489, filed on Nov. 21, 2008, now Pat. No. 8,471,312.

(30) Foreign Application Priority Data

Nov. 30, 2007 (JP) ................. 2007-311183

(51) Int. Cl.
  H01L 27/146 (2006.01)
  H04N 5/3745 (2011.01)
(52) U.S. Cl.
  CPC ........ H04N 5/3745 (2013.01); H01L 27/1461 (2013.01); H01L 27/14603 (2013.01); H01L 27/14614 (2013.01); H01L 27/14641 (2013.01); H01L 27/14643 (2013.01)
(58) Field of Classification Search
  CPC ............. H01L 27/14643; H01L 27/14609; H01L 27/14689; H01L 27/14603; H01L 27/1463; H01L 27/14612; H01L 27/14627
  See application file for complete search history.

(56) References Cited

U.S. PATENT DOCUMENTS 7,244,920 B2 * 7/2007 Kim ................. H01L 27/14603
                                                    250/208.1
2005/0274874 A1  12/2005 Nozaki et al.

FOREIGN PATENT DOCUMENTS

| JP | 2005-101442 | 4/2005 |
| JP | 2005-328326 | 11/2005 |
| JP | 2006-086241 | 3/2006 |
| JP | 2006-237361 | 9/2006 |
| JP | 2007-115994 | 5/2007 |
| WO | WO 2006/124384 | 11/2006 |

OTHER PUBLICATIONS

Official Action (no English translation available) for Japanese Patent Application No. 2015-071330 mailed Mar. 1, 2016, 7 pages.
Official Action (no English translation available) for Japanese Patent Application No. 2015-071330 mailed Sep. 6, 2016, 7 pages.

* cited by examiner

*Primary Examiner* — Tony Tran
(74) *Attorney, Agent, or Firm* — Sheridan Ross P.C.

(57) ABSTRACT

A solid-state imaging device which includes a plurality of pixels in an arrangement, each of the pixels including a photoelectric conversion element, pixel transistors including a transfer transistor, and a floating diffusion region, in which the channel width of transfer gate of the transfer transistor is formed to be larger on a side of the floating diffusion region than on a side of the photoelectric conversion element.

9 Claims, 9 Drawing Sheets

SOLID-STATE IMAGING DEVICE AND CAMERA

CROSS REFERENCES TO RELATED APPLICATIONS

This application is a continuation of U.S. patent application Ser. No. 14/490,345, filed Sep. 18, 2014, which is a division of patent application Ser. No. 13/721,915, filed Dec. 20, 2012, which is a continuation of U.S. patent application Ser. No. 12/275,489, filed Nov. 21, 2008, now U.S. Pat. No. 8,471,312, which claims priority to Japanese Patent Application No. JP 2007-311183, filed in the Japanese Patent Office on Nov. 30, 2007, the entire contents of which are hereby incorporated herein by reference.

BACKGROUND OF THE INVENTION

1. Field of the Invention

The invention generally relates to solid-state imaging devices and cameras. More particularly, the invention relates to a solid-state imaging device and a camera provided with the solid-state imaging device.

2. Description of the Related Art

Solid-state imaging devices are classified broadly into amplification type solid-state imaging devices, which are typically exemplified by CMOS (complementary metal-oxide semiconductor) image sensors, and charge transfer type imaging devices, which are typified by CCD (charge-coupled device) image sensors.

CMOS image sensors have replaced CCD sensors at rapid speed particularly in the area of portable device-oriented image sensors owning to high performance and low power consumption characteristics. Such a CMOS image sensor includes an imaging section having a plurality of pixels arranged in a two-dimensional array, each of the pixels including a photodiode (PD) serving as a photoelectric conversion element and several pixel transistors; and peripheral circuits arranged around the imaging section.

The peripheral circuits include at least column circuits or vertical driving circuits for transmitting signals in the column direction, and horizontal circuits or horizontal driving circuits for sequentially transferring the signals, which are transmitted column wise by the column circuits, to an output circuit. The pixel transistors are provided having known configurations such as, for example, four-transistor circuit configuration including transfer, reset, amplifying, and selection transistors; and three-transistor circuit configuration including transfer, reset, and amplifying transistors excepting the selection transistor.

A CMOS image sensor is generally provided by arranging a plurality of unit pixels, in which each of the unit pixels includes one photodiode and several pixel transistors, as a set. However, miniaturization of the pixel size has been notable in recent years. With regard to the CMOS image sensor including a large number of pixels, many attempts have been disclosed on CMOS image sensors of the type of sharing pixel transistors with a plurality of pixels to thereby reduce the number of pixel transistors.

One of the CMOS image sensors sharing pixel transistors is disclosed, for example, in Japanese Unexamined Patent Application Publication No. Heisei 11 (1999)-331713 which will be given shortly.

On the other hand, another disclosure is made in which the transfer efficiency of charges can be increased by suitably devising the structure of transfer gate in miniaturized design of the pixel. For example, disclosed in Japanese Unexamined Patent Application Publication No. 2005-129965 (in paragraph 0039 and FIG. 3 therein) is that a photodiode PD, a floating diffusion (FD) region 101, and a transfer transistor Tr1 as one of the pixel transistors are formed as a part of pixel, as illustrated in FIG. 1. The transfer transistor Tr1 includes a transfer gate electrode 102 and a channel region 103 formed directly thereunder. Also, in the transfer transistor Tr1, the edge of a transfer gate 104, or of the transfer gate electrode 102, toward the photodiode PD, is formed in the shape of convex so that the electric field is generated in the photodiode PD toward the transfer gate 104 with more ease. It may be noted in the structure of FIG. 1 that the channel width "a" of the transfer gate 104 on the side of photodiode PD (i.e., the channel width in contact with the photodiode PD), is larger than the channel width "b" on the side of floating diffusion (FD) region 101 (i.e., the channel width in contact with the floating diffusion (FD) region 101).

SUMMARY OF THE INVENTION

With regard to CMOS image sensor, the gate size of the pixel transistors included in pixels decreases with the decrease in pixel size, and it has become more difficult to maintain the characteristics of the pixel transistors. As an example, it is difficult for the gate of transfer transistor (hereinafter referred to as transfer gate) for reading out signal charges from a photodiode PD to a floating diffusion (FD) region as well, to satisfy both cutoff characteristics and charge transfer characteristics of the transfer transistor at the same time. That is, the leak current is generated more easily from a photodiode (PD) to a floating diffusion (FD) region when the transfer gate is turned off, while a potential barrier has become difficult to be sufficiently lowered when the transfer gate is turned on for the readout period because of weak channel modulation by the transfer gate.

However, there exist trade-offs between the size of transfer gate and photoelectric conversion efficiency, in which further increase in the size of transfer gate within a given pixel area may increase risks, such as reducing the area of photodiode PD for photoelectric conversion and intercepting some of incident light with the transfer gate when focusing light.

In this regard, with the structure of transfer gate shown in FIG. 1 there may be a risk of reducing the area of photodiode PD since the transfer gate is formed to protrude toward the photodiode PD. This structure of the transfer gate therefore may reduce the amount of saturation charges and cause the interception of incident light.

In light of the foregoing points, it is desirable to provide a solid-state imaging device capable of maintaining transistor characteristics of a transfer transistor included in the device yet securing a sufficient area of light receiving surface of a photoelectric conversion element even when the pixel size is miniaturized, and also a camera provided with the solid-state imaging device.

A solid-state imaging device according to an embodiment of the invention includes a plurality of pixels in an arrangement, each of the pixels including a photoelectric conversion element, pixel transistors including a transfer transistor, and a floating diffusion region. A channel width of a transfer gate of the transfer transistor on a side of the floating diffusion region is formed to be larger than on a side of the photoelectric conversion element.

A camera according to an embodiment of the invention includes a solid-state imaging device, an optical system configured to lead incident light to a photoelectric conversion element included in the solid-state imaging device, and a signal processing circuit configured to process signals output from the solid-state imaging device. The solid-state imaging device includes a plurality of pixels in an arrangement, each of the pixels including a photoelectric conversion element, pixel transistors including a transfer transistor, and a floating diffusion region. A channel width of a transfer gate of the transfer transistor on a side of the floating diffusion region is formed to be larger than on a side of the photoelectric conversion element.

In the pixel included in the solid-state imaging device according to an embodiment of the invention, the channel width of the transfer gate of the transfer transistor on the side of the floating diffusion region is formed to be larger than on the side of the photoelectric conversion element. As a result, even when the pixel size is miniaturized, the potential of a channel region becomes deeper on the side of floating diffusion region than on the side of photoelectric conversion element when the transfer gate is turned on during a readout period, and the electrical field can be generated with more ease in the direction of charge transfer. In addition, when the transfer transistor is turned off, the leak current from the photoelectric conversion element to the floating diffusion region is suppressed. Still in addition, since the transfer gate is formed without protruding its part toward the photoelectric conversion element, the area of light receiving surface of the photoelectric conversion element can be secured.

According to an embodiment of the present invention, the transistor characteristics of the transfer transistor can be maintained. Therefore, even when the pixel size is miniaturized, the capability of transferring signal charges from the photoelectric conversion element to the floating diffusion region can be improved. In addition, the area of light receiving surface of the photoelectric conversion element can be fully secured.

BRIEF DESCRIPTION OF THE DRAWINGS

The preferred embodiments of the invention will be described in detail with reference to the following drawings, wherein.

DESCRIPTION OF THE PREFERRED EMBODIMENTS

Figure 1:
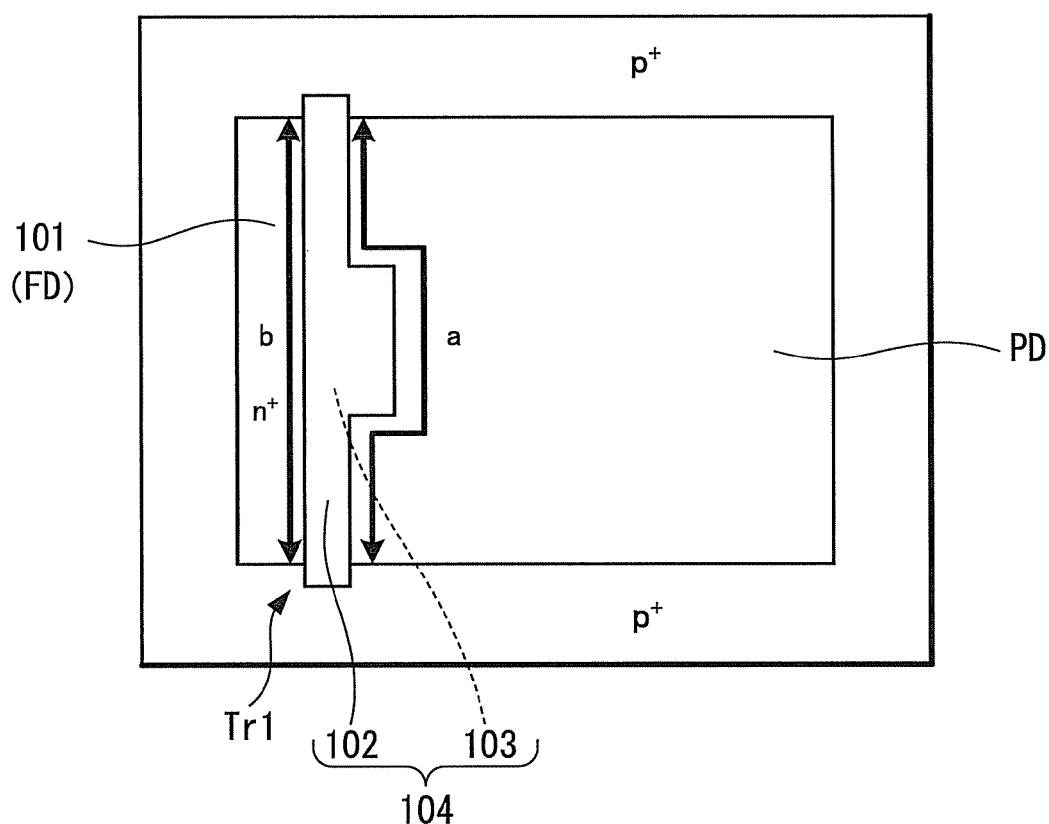
FIG. 1 is a view illustrating main portions of a pixel of the related art.

The present invention will be described hereinbelow on a variety of embodiments by referring to the accompanying drawings. It is not intended to be exhaustive or to limit the invention to those disclosed in the embodiments and illustrated in the drawings.

Figure 2:
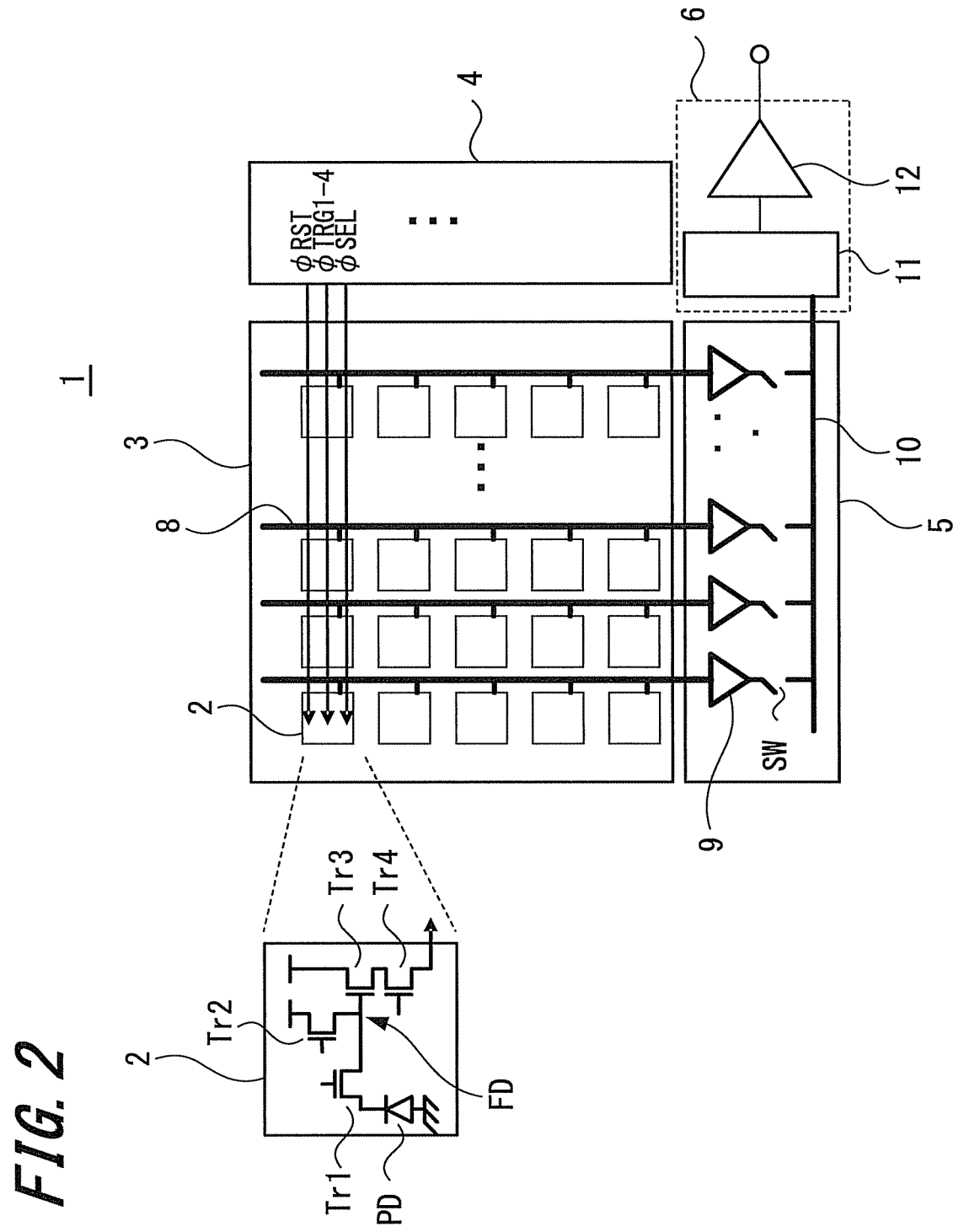
FIG. 2 is a schematic view illustrating a configuration of a solid-state imaging device according to an embodiment of the present invention.

FIG. 2 is a schematic view illustrating a configuration of a solid-state imaging device or CMOS image sensor according to an embodiment of the present invention. Referring to FIG. 2, a solid-state imaging device 1 according to the present embodiment includes an imaging section 3 (i.e., pixel section) having a plurality of pixels 2 arranged in a two-dimensional array, and peripheral circuits arranged around the imaging section 3, having a vertical driving unit 4, a horizontal transfer unit 5, and an output unit 6. Each of the pixels 2 includes a photodiode PD serving as a photoelectric conversion element and several pixel transistors (MOS transistors) Tr.

The photodiode PD includes a region configured to accumulate signal charges generated by the photoelectrical conversion of incident light. The several pixel transistors Tr include four MOS transistors, in this example, a transfer transistor Tr1, a reset transistor Tr2, an amplifying transistor Tr3, and a selection transistor Tr4.

The transfer transistor Tr1 serves as a transistor for reading out the signal charges accumulated in the photodiode PD to a floating diffusion (FD) region which will be described later on. The reset transistor Tr2 is a transistor for setting the potential of the floating diffusion (FD) region to a predetermined value. The amplifying transistor Tr3 is a transistor for electrically amplifying the signal charges readout to the floating diffusion (FD) region. The selection transistor Tr4 is a transistor for selecting a line of pixels and reading out pixel signals therein to the vertical signal line 8. In addition, although no drawing is provided herein, the pixel may alternatively be formed with the photodiode PD and three transistors including the transfer, reset, and amplifying transistors excepting the selection transistor Tr4.

In the circuit configuration of pixel 2, the source of the transfer transistor Tr1 is connected to the photodiode PD, and the drain of Tr1 is connected to the source of the reset transistor Tr2. The floating diffusion (FD) region serving as a charge-voltage conversion unit, which is arranged between the transfer transistor Tr1 and the reset transistor Tr2 (equivalent to the drain region of the transfer transistor Tr1 and the source region of the reset transistor Tr2), is connected to the gate of the amplifying transistor Tr3. The source of the amplifying transistor Tr3 is connected to the drain of the selection transistor Tr4. The drains of reset transistor Tr2 and amplifying transistor Tr3 are both connected to a source voltage supply unit. In addition, the source of the selection transistor Tr4 is connected to the vertical signal line 8.

The vertical driving unit 4 is configured to respectively supply a line reset signal ΦRST to be applied in common to the gates of the reset transistors Tr2 of the pixels arranged on one line, a line transfer signal ΦTRG to be applied in common to the gates of the transfer transistors Tr1 of the pixels arranged on one line, and a line selection signal ΦSEL to be applied in common to the gates of the selection transistors Tr4 of the pixels arranged on one line.

The horizontal driving unit 5 includes amplifiers or analog-to-digital converters (ADC) connected to the vertical signal line 8 of each column, such as analog-to-digital converters 9 in the present example; column selection circuits (switch units) SW; and a horizontal transfer line 10 (bus including the same number of lines as data bit lines, for example).

The output unit 6 includes a further amplifier, or analog-to-digital converter and/or signal-processing circuit; such as signal-processing circuit 11 in the present example for processing outputs from the horizontal transfer line 10 and an output buffer 12.

The solid-state imaging device 1 is configured for the signals from the pixels 2 on each line to be subjected to analog-to-digital conversion with each analog-to-digital converter 9, readout to the horizontal transfer line 10 through the column selection circuits SW which are sequentially selected, and transferred sequentially in the horizontal direction. Image data readout to the horizontal transfer line 10 are subsequently output from the output buffer 12 through the signal-processing circuit 11.

The operation with the pixel 2 is carried out in general as follows. First, by turning on the gates of transfer transistor Tr1 and reset transistor Tr2, the charges in the photodiode PD are all cleared out. Thereafter, the gates of the transfer transistor Tr1 and the reset transistor Tr2 are turned off, and photoelectric charge accumulation is carried out. Next, immediately before reading photoelectric charges accumulated in the photodiode PD, the gate of the reset transistor Tr2 is turned on and the potential of the floating diffusion (FD) region is reset. Subsequently, by turning off the gate of the reset transistor Tr2 and turning on the gate of the transfer transistor Tr1, respectively, the photoelectric charges from the photodiode PD are transferred to the floating diffusion (FD) region. The amplifying transistor Tr3 electrically amplifies the signal charges upon receiving the charges at the gate thereof. On the other hand, from the moment of abovementioned reset of the potential of the floating diffusion (FD) region immediately before the charge reading, the selection transistor Tr4 is turned on only for the pixel 2 to be presently readout. Subsequently, image signals subjected to charge-to-voltage conversion and supplied from the amplifying transistor Tr3 included in the presently addressed pixel 2 are readout to the vertical signal line 8.

According to the present embodiment, the solid-state imaging device 1 includes the transfer gate of the transfer transistor Tr1 configured so that the transfer of signal charges to the floating diffusion (FD) region can sufficiently be carried out even in the case of miniaturized pixel size, while fully securing the area of photodiode PD. That is, in the present embodiment, the channel width of the transfer gate of the transfer transistor Tr1 on the side of the floating diffusion (FD) region is formed to be larger than on the side of the photodiode PD. Moreover, conversion efficiency can also be improved with this configuration.

Figure 3:
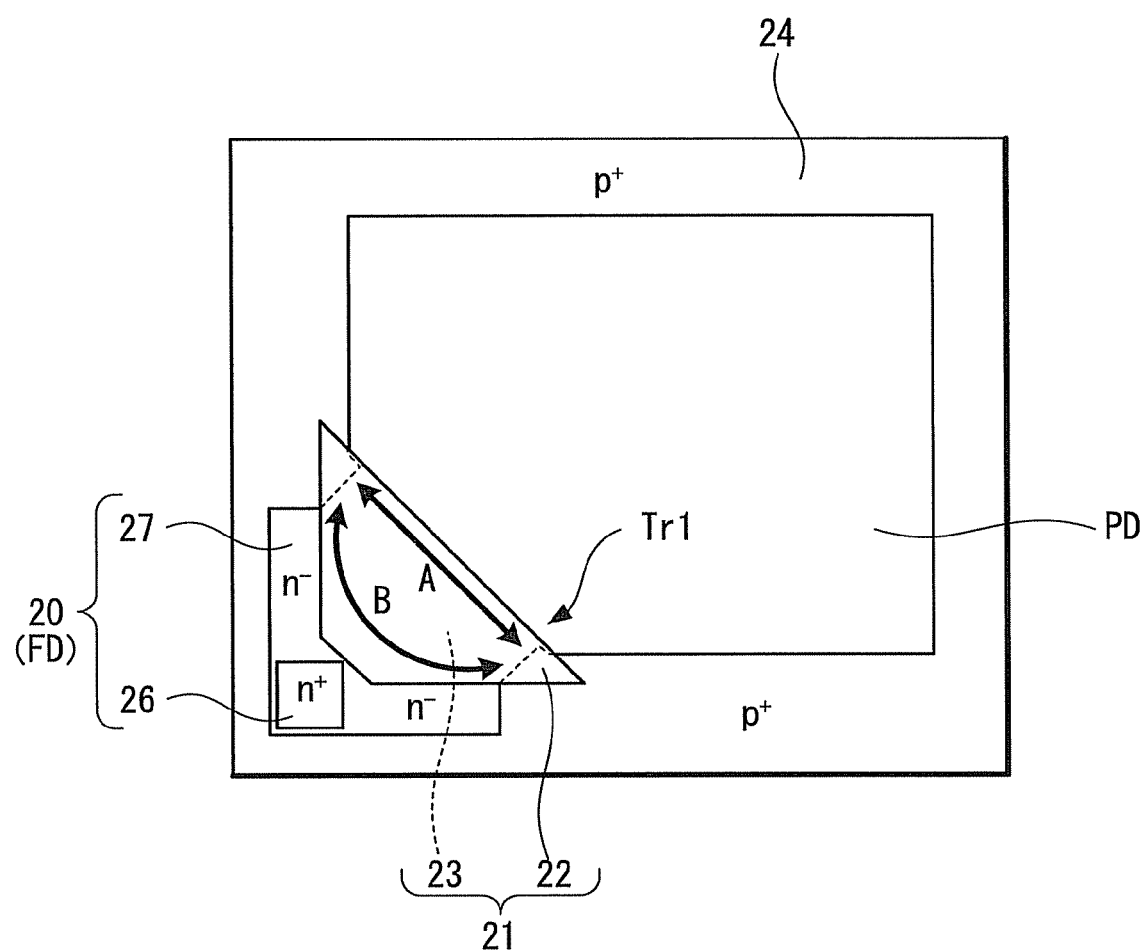
FIG. 3 is a view illustrating main portions of a first example of a pixel according to an embodiment of the present invention.

FIG. 3 is a view illustrating a first example of a pixel according to an embodiment of the present invention, which includes a photo-diode PD, a floating diffusion (FD) region 20, and a transfer transistor Tr1 particularly illustrating its transfer gate 21. In the first example illustrated in FIG. 3, a transfer gate electrode 22 constituting the transfer gate 21 of the transfer transistor Tr1 is arranged at a corner portion of the square planar photodiode PD, having a convex-shape with its top portion facing a side of the floating diffusion (FD) region 20.

That is, the transfer gate electrode 22 is formed in the shape of near trapezoid, or triangle with its top portion being removed, so that one (the base) of the sides thereof is adjacent to the side of the square photodiode PD intercepted slant by the trapezoid, and approximately L-shaped two sides thereof are adjacent to the floating diffusion (FD) region 20. As a result, the photodiode PD of unit pixel illustrated in the drawing is formed in the shape of pentagon that is resulted from the planar form of square or rectangle of the photodiode PD by slightly and linearly taking off one of the corner portions. In addition, the floating diffusion (FD) region 20 is formed nearly in the planar shape of the character "L".

A device isolation region 24 is formed so as to surround the photodiode PD, floating diffusion (FD) region 20, and transfer transistor Tr1, and extends partially under the transfer gate electrode 22. That is, a part of the device isolation region 24 is formed to extend under the transfer gate electrode 22 so that the substantial portion of a channel region 23 of the transfer gate 21 extends to the side of photodiode PD, having the width sufficient to cover the full breadth of the L-shaped floating diffusion (FD) region 20.

Although no drawing is provided herein, the photodiode PD is formed in the present example as a buried-type photodiode PD which includes an n-type semiconductor region (n+ region) used as a charge accumulation region formed in a p-type semiconductor well region, and a p-type semiconductor region (p+ region) serving as an accumulation layer formed on the surface side of the n-type semiconductor region. In addition, the floating diffusion (FD) region 20 as the region equivalent to the drain region of the transfer transistor Tr1, is formed with the n-type semiconductor region (n+ region) in this example. Still in addition, the device isolation region 24 is formed with the p-type semiconductor region (p+ region) in this example.

Moreover, in the example, a part of the nearly L-shaped floating diffusion (FD) region 20, that is, the portion thereof facing the top portion of the transfer gate electrode 22 (the top of the aforementioned convex-shape) is formed as the high impurity concentration region having a small area (i.e., high concentration region: n+ region in this example) 26. In addition, other portions of the nearly L-shaped floating diffusion (FD) region 20, that is, the portions surrounding the high concentration region 26 or corresponding to the region between the high concentration region 26 and device isolation region 24, are formed as a region 27 having an impurity concentration (i.e., low concentration region: n− region in this example) lower than the high concentration region 26.

The impurity concentration of the low concentration region 27 is lower than the low concentration region in a typical LDD structure, and the region 27 has an area larger than the low impurity concentration region automatically formed in a typical process of PN junction formation.

On the other hand, the high concentration region 26 in the floating diffusion (FD) region 20 is shared with the contact region for use in connecting to pixel transistors. In this example, the impurity concentration of the high concentration region 26 may reach $1 \times 10^{20}$ cm$^{-2}$ or higher. In addition, the impurity concentration of the low concentration region 27 may be less than $1 \times 10^{18}$ cm$^{-3}$.

According to the first example, since the transfer gate electrode 22 is formed in the shape of nearly trapezoid with a convex top portion facing the floating diffusion (FD) region 20, the reduction of photodiode PD area affects only slightly the corner portion of photodiode PD and therefore the area for the photodiode PD can be secured to remain broad. As a result, even if the pixel is miniaturized, light incident on the photodiode PD may not be affected by the transfer gate electrode during light focusing and the amount of saturation charges can be fully secured.

In addition, as illustrated in FIG. 3, since the channel width of the transfer gate 21 on the side of the floating diffusion (FD) region 20 is formed to be larger than on the side of the photodiode PD, cutoff characteristics and charge transfer characteristics of the transfer transistor Tr1 can be made compatible, thereby maintaining transistor characteristics.

That is, the channel width B on the side of the floating diffusion (FD) region 20 is larger than the channel width A on the side of photodiode PD. This change in the channel width leads to the change in the potential of the channel region 23, and the electrical field is generated owning to the shape effect so that the potential becomes deeper on the side of the floating diffusion (FD) region 20 than on the side of the photodiode PD when the transfer transistor Tr1 is turned on. For the narrow channel width A, the potential is shallow, while for the wide channel width B, the potential becomes deep. Therefore, the transfer of signal charges from the photodiode PD to the floating diffusion (FD) region 20 can be carried out satisfactorily, and the transfer capability for signal charges can be improved even the pixels are miniaturized. In addition, leak current generation is suppressed when the transfer transistor Tr1 is turned off.

The reason for the leak current suppression will be described as follows. In the case where the channel width W is constant throughout, the amount of change in channel potential is the same at both sides on the photodiode PD and the floating diffusion (FD) region. As a result, when a potential difference is generated so as to apply an electric field to the channel region for defining the transfer direction with the transfer gate being turned on, this causes that much amount of potential difference even when the transfer gate is turned off.

In contrast, according to the example, since the potential change in the transfer gate 21 on the side of the photodiode PD is larger than on the side of floating diffusion (FD) region 20, the potential difference at the time of the transfer gate 21 off can be made small, supposing the channel potential difference between the transfer gate 21 on the sides of the photodiode PD and the floating diffusion (FD) region is the same as the above at the time of the transfer gate on. That is, the channel on the side of the floating diffusion (FD) is closed as compared to the side of the photodiode PD at the time of the transfer gate off, so that the leak current can be reduced.

By forming the high concentration region 26 of the floating diffusion (FD) region 20 in common or shared with the contact region, the area of the high concentration region can be minimized. In the example, the high concentration region 26 is not necessary at the locations other than the contact region. Since the high concentration region is formed by impurity implantation using a photoresist mask in a typical CMOS process, this region is an area larger than the contact area for the contact region. The device structure is not configured in general so that the high impurity concentration is formed only in the portion of the floating diffusion (FD) region which is in contact with the gate.

On the other hand, when the floating diffusion (FD) region 20 is formed in the shape of L character, the area of the floating diffusion (FD) region 20 is increased. The increase in the area usually causes the increase in diffusion capacity (i.e., junction capacity) in the floating diffusion (FD) region 20 and the decrease in conversion efficiency.

In the example, however, the distribution of impurity concentration is suitably designed so that the n-type high concentration region 26 in the floating diffusion (FD) region 20 is formed as the part facing the convex portion of the transfer gate electrode 21, being effective for substantially accumulating electric charges and being the contact region; and that the other part in the floating diffusion (FD) region 20 is formed as the n-type low concentration region 27. The junction capacity of the low concentration region 27 is quite small. Therefore, the junction capacity of the floating diffusion (FD) region 20 as a whole may not increase considerably and the decrease in conversion efficiency is alleviated.

Signal charges transferred from the photodiode PD to the low concentration region 27 having shallow potential in the floating diffusion (FD) region 20 are collected to the high concentration region 26 having deep potential.

Figure 4:
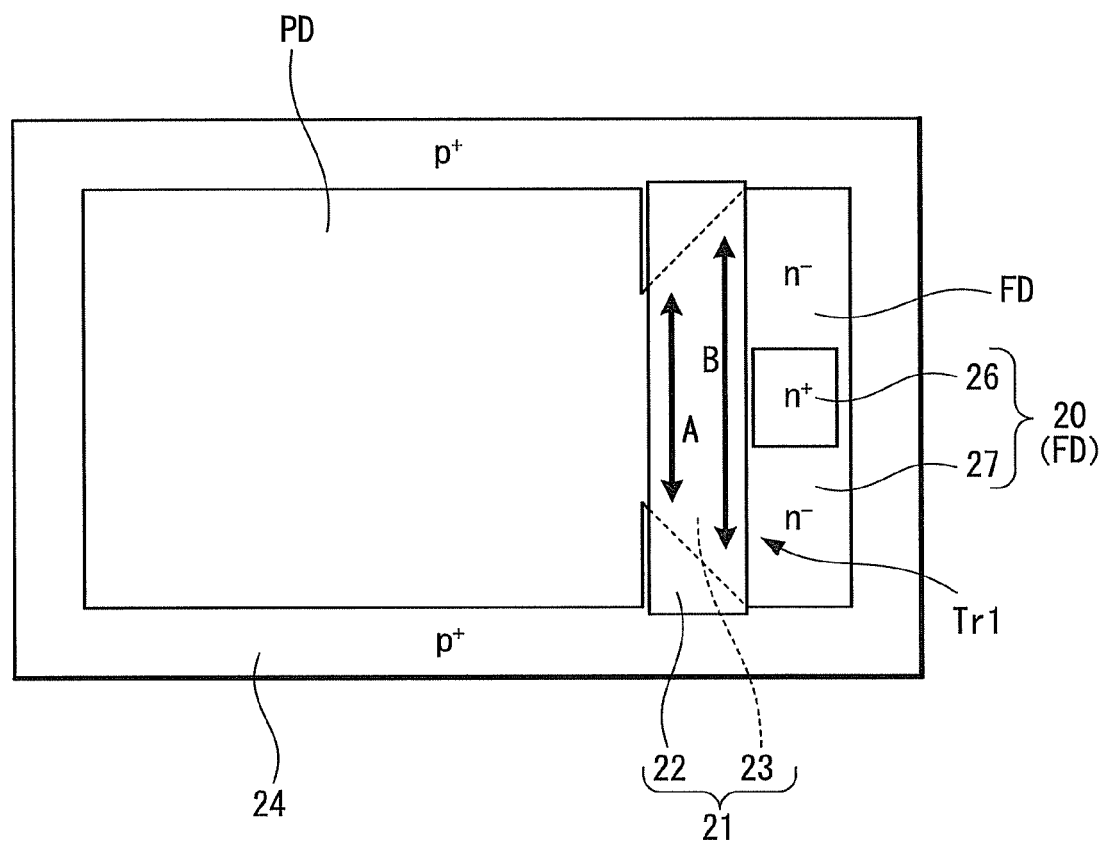
FIG. 4 is a view illustrating main portions of a second example of a pixel according to an embodiment the present invention.

FIG. 4 is a view illustrating a second example of a pixel according to an embodiment of the present invention, which includes a photodiode PD, a floating diffusion (FD) region 20, and a transfer transistor Tr1 particularly illustrating its transfer gate 21. In this example illustrated in FIG. 4, the transfer transistor Tr1 includes a transfer gate 21 formed between a photodiode PD and a floating diffusion (FD) region 20, the channel width of the transfer gate 21 on a side of the floating diffusion (FD) region 20 is formed larger than on a side of the photodiode PD.

The photodiode PD is formed in a quadrilateral shape such as a square or rectangle. The floating diffusion (FD) region 20 is formed in the shape of rectangle, in which one of the sides thereof facing the photodiode PD is in the same length as the opposing side of the photodiode PD. The transfer gate 21 includes a rectangular transfer gate electrode 22 and a trapezoidal channel region 23. The channel region 23 is formed as a trapezoid so that the channel width A thereof on the side of photodiode PD is narrower than the width B on the side of the floating diffusion (FD) region 20 and that the channel width of channel region 23 of the transfer gate 21 is gradually increased from the side on the photodiode PD to the side on the floating diffusion (FD) region 20.

On the other hand, the floating diffusion (FD) region 20 includes a high impurity concentration region 26 (n+ region in this example) formed at the center of the rectangular floating diffusion (FD) region 20 in a manner similar to the aforementioned example, and a low concentration region 27 (n− region in this example) formed on the remaining portions of the (FD) region 20. Since the device structure and other features such as impurity concentration and the like are similar to those described earlier in the first example, the description thereof is not repeated herewith.

According to the second example, the area of the photodiode PD can be secured to remain broad by forming the photodiode PD in the shape of square, and the amount of saturation charges can be fully secured even when the pixel size is miniaturized. In addition, the electrical field is generated in the channel region 23 of the transfer gate 21 so that the potential becomes gradually deeper from the side on the photodiode PD toward the side on the floating diffusion (FD) region 20. Therefore, the transfer of signal charges from the photodiode PD to the floating diffusion (FD) region 20 can be carried out satisfactorily, and the transfer capability for signal charges can be improved even when the pixels are miniaturized.

On the other hand, since the floating diffusion (FD) region 20 includes the high concentration region 26 and the low concentration region 27, the junction capacity of the floating diffusion (FD) region 20 as a whole can remain low and the decrease in conversion efficiency is alleviated.

According to the second example, the signal charges transferred to the low concentration region 27 of the floating diffusion (FD) region 20 are also collected to the high concentration region 26. In addition, the effects similar to those of the first example can be obtained also in this second example.

The device configuration of the first example illustrated in FIG. 3 is suitably used in the CMOS image sensor in which pixel transistors are shared with a plurality of photodiodes PD. Next, a further embodiment with regard to such a device configuration will be described.

Figure 5:
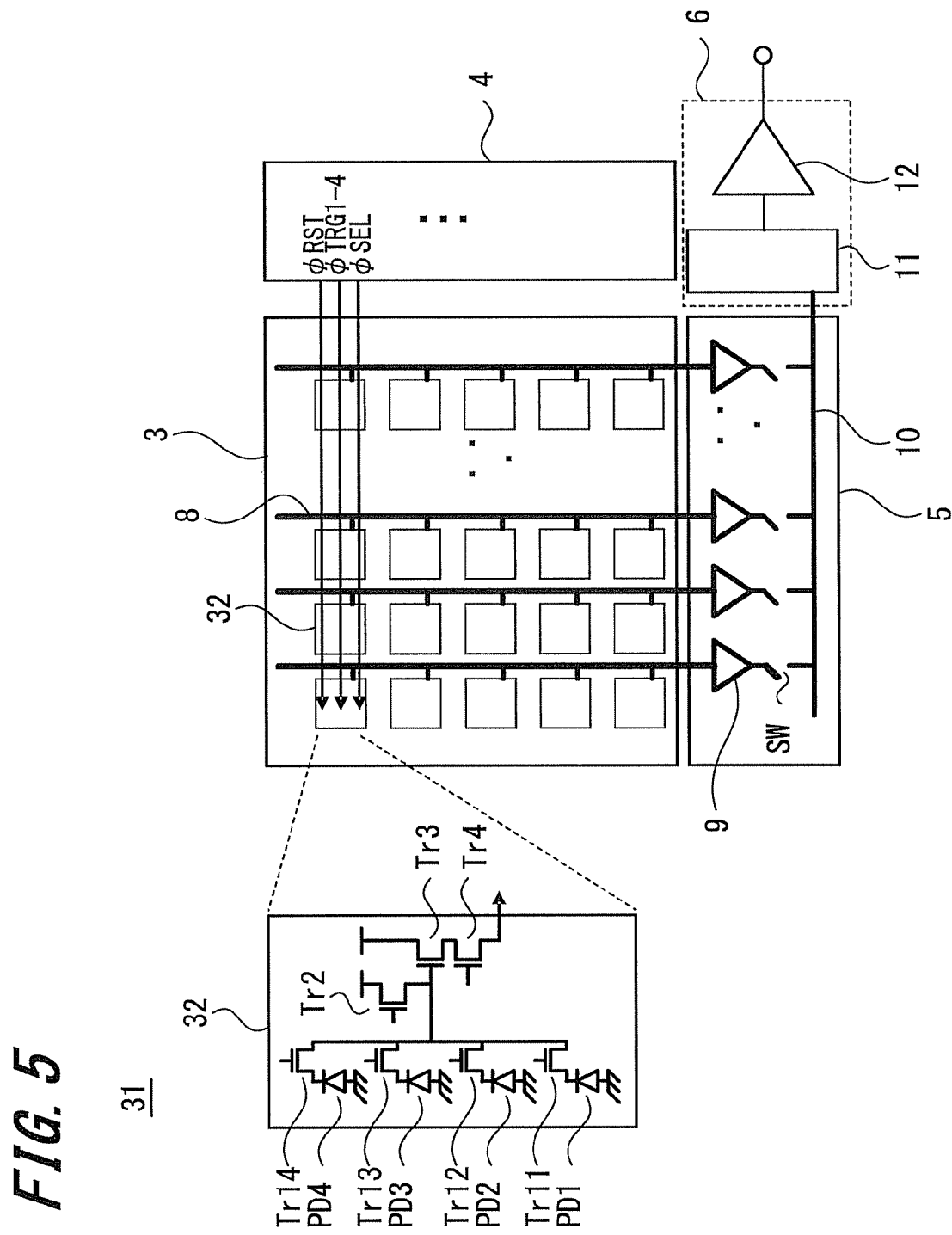
FIG. 5 is a schematic view illustrating a configuration of a solid-state imaging device according to another embodiment of the present invention.

FIG. 5 is a schematic view illustrating a configuration of a solid-state imaging device or CMOS image sensor according to another embodiment of the present invention. The solid-state imaging device of the present embodiment is the case where a plurality of sets are arranged, in that the set herein is formed including (i) a plurality of pixels respectively provided with photodiodes PD as photoelectric conversion elements, i.e., four pixels respectively provided therein with four photodiodes PD in this example, and (ii) pixel transistors other than the transfer transistor, which are shared with the four photodiodes PD or pixels (i.e., the set being hereinafter referred to as sharing pixel).

Referring to FIG. 5, a solid-state imaging device 31 according to the present embodiment includes an imaging section 3 (i.e., pixel section) having a plurality of sharing pixels 32 arranged in a two-dimensional array, and peripheral circuits arranged around the imaging section 3, such as a vertical driving unit 4, a horizontal transfer unit 5, and an output unit 6. Each of the sharing pixels 32 includes a plurality of photodiodes PD serving as photoelectric conversion elements, i.e., four photodiodes PD in this example, four transfer transistors, one reset transistor, one amplifying transistor, and one selection transistor. That is, the pixel transistors other than the transfer transistor such as the reset, amplifying, and selection transistors are shared with the four photodiodes PD, as mentioned above.

In the circuit configuration of the sharing pixel 32, as shown in FIG. 5, these four photodiodes PD1, PD2, PD3, and PD4 are connected to the sources of corresponding four transfer transistors Tr11, Tr12, Tr13, and Tr14, respectively, and the drains of the four transfer transistors Tr11, Tr12, Tr13, and Tr14 are connected to the source of one reset transistor Tr2. The common floating diffusion (FD) region serving as charge-voltage conversion unit formed between the transfer transistors Tr11, Tr12, Tr13, and Tr14 and the reset transistor Tr2 is connected to the gate of the one amplifying transistor Tr3. The source of the amplifying transistor Tr3 is connected to the drain of the one selection transistor Tr4. The drains of the reset transistor Tr2 and the amplifying transistor Tr3 are both connected to a source voltage supply unit. In addition, the source of the selection transistor Tr4 is connected to the vertical signal line 8.

To the gates of the transfer transistors Tr11, Tr12, Tr13, and Tr14, line transfer signals ΦTRG1, ΦTRG2, ΦTRG3, and ΦTRG4 are applied, respectively. A line reset signal ΦRST is applied to the gate of the reset transistor Tr2, and a line selection signal ΦSEL is applied to the gate of the selection transistor Tr4.

Since the configuration of the vertical driving unit 4, horizontal transfer unit 5, output unit 6 and the like are similar to those described earlier referring to FIG. 2, the description thereof is not repeated herewith.

Figure 6:
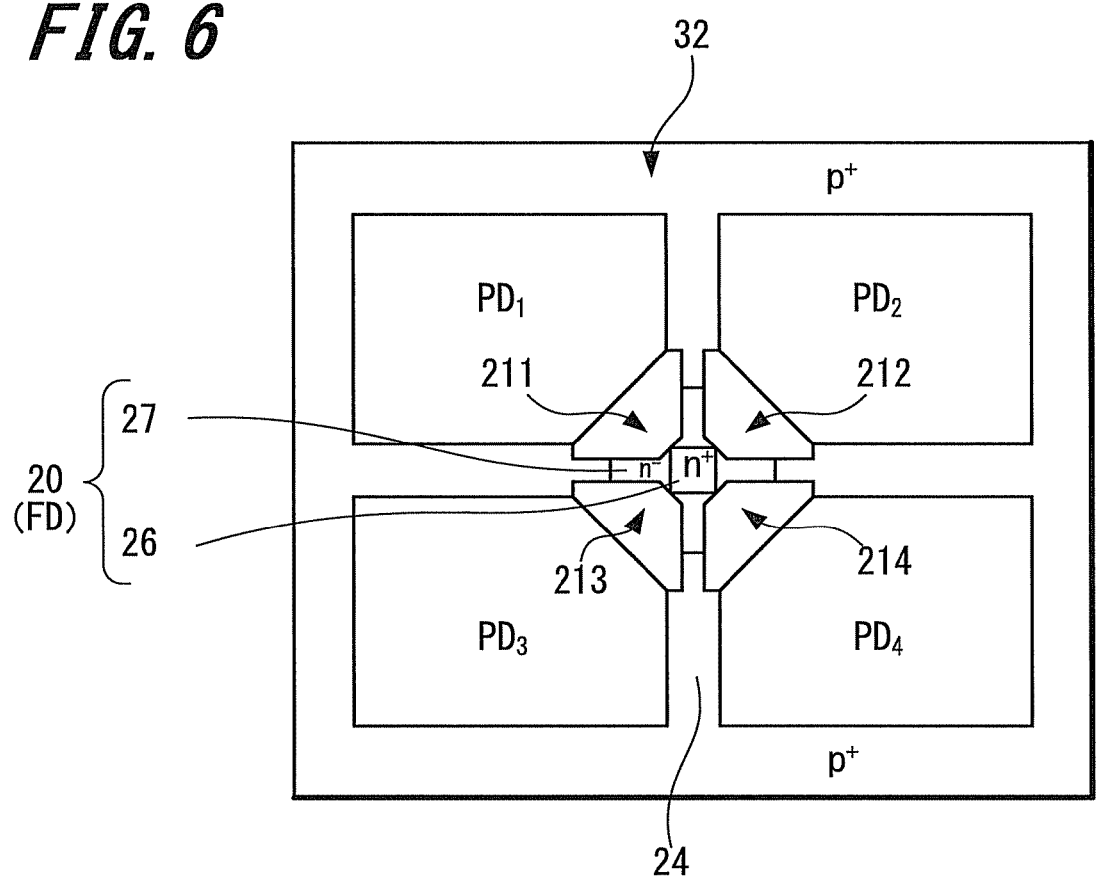
FIG. 6 is a view illustrating main portions of a third example of a pixel according to an embodiment of the present invention.

FIG. 6 is a view illustrating the planar configuration of the sharing pixel 32 of a third example according to another embodiment of the invention. A set of the sharing pixel 32 according to this example uses the aforementioned pixel structure as shown in FIG. 3 and includes four pixels in a two-by-two pixel sharing configuration arranged with two of them horizontally and two of them vertically.

In this example, as shown in FIG. 6, the common floating diffusion (FD) region 20 is arranged at the center of the structure so that the floating diffusion (FD) regions 20 may be shared with each other. So as to hold the common floating diffusion (FD) region 20 in the middle of the structure, four pixels (each having the pixel structure shown in FIG. 3) are arranged horizontally and vertically to be point symmetric centering on corner portions 211, 212, 213, and 214 on the side of the transfer gate 21. Therefore, the floating diffusion (FD) region 20 at the center is formed in the planar shape of cross having a high concentration region 26 at its center and low concentration regions 27 each on the arm portions of the cross. In addition, in regard to the contact with the floating diffusion (FD) region 20, the device isolation region 24 for isolating respective photodiodes PD1, PD2, PD3, and PD4 is brought to be in contact only with the top portion of the low concentration regions 27 on the arm portion.

Since other features are similar to those described earlier with reference to FIG. 3, the description thereof is not repeated herewith.

With the configuration of sharing pixel according to the third example, by disposing the four pixels to be point symmetric centering on the floating diffusion (FD) region 20, namely, on the corner portions of the transfer gate 21, it becomes possible to densely arrange pixels in the imaging section 3 in which a large number of pixels are mounted as will be described later on. Also, according to the example, since the channel width of the transfer gate 21 increases from the side on the photodiode PD toward the side on the floating diffusion (FD) region 20 and the channel potential changes accordingly owning to the shape effect of the transfer gate 21 in a manner similar to the aforementioned example, the transfer efficiency of signal charges is improved.

Moreover, since the common floating diffusion (FD) region 20 is formed in the shape of cross having its central portion as the high concentration region 26 and the other portions thereof as the low concentration regions 27, the junction capacity of the floating diffusion (FD) region 20 decreases considerably, the charge-voltage conversion efficiency is improved, or the decrease in the conversion efficiency is reduced. Particularly, the portion of contact between the n-type floating diffusion (FD) region 20 and the p-type device isolation regions 24 is only the arm edge portion formed as the cross shaped low concentration region 27, the junction capacity between the floating diffusion (FD) region 20 and the device isolation regions 24 is further decreased, and the conversion efficiency is improved accordingly. In addition, similar effects to those of the first example are also obtained in the present embodiment.

Figure 7:
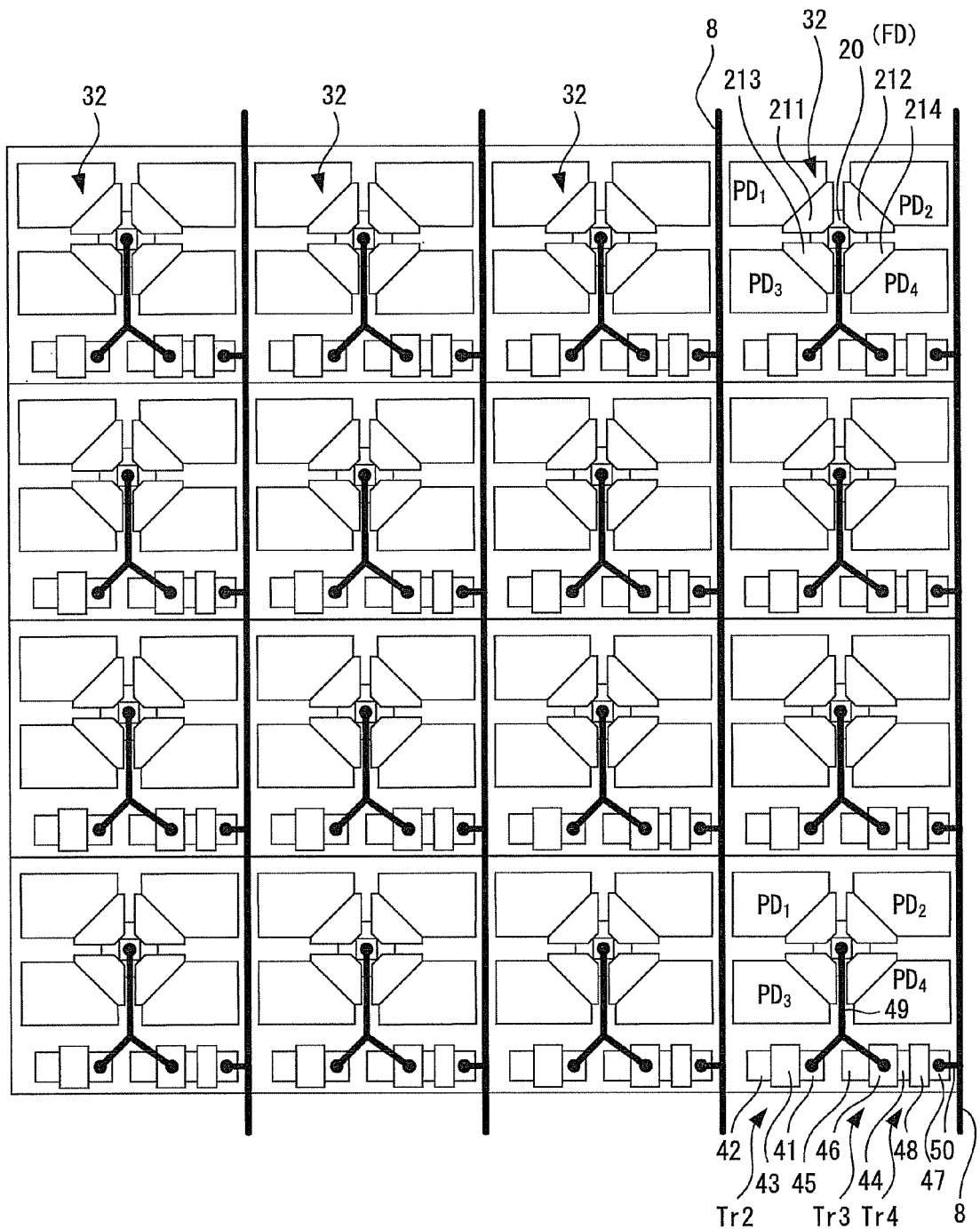
FIG. 7 is a plan view illustrating an example of a layout of an imaging section using sharing pixel shown in FIG. 6.

FIG. 7 is a schematic view illustrating a layout of the imaging section 3 using the sharing pixel 32 shown in FIG. 6. This example illustrates the layout with a plurality of sharing pixels 32 arranged in a square array. That is, in the layout of the example, a set of reset transistor Tr2, amplifying transistor Tr3, and selection transistor Tr4 are arranged on one of the sides of respective sharing pixels 32 in the vertical direction, or on the bottom side in this example. A plurality of such structure of sharing pixels 32 are arranged horizontally and vertically as an orthogonal coordinate array system.

The reset transistor Tr2 includes a source region 41, a drain region 42, and a reset gate electrode 43. The amplifying transistor Tr3 includes a source region 44, a drain region 45, and an amplifying gate electrode 46. The selection transistor Tr4 includes a source region 47, a drain region 44, and a selection gate electrode 48. In providing the above structure, the source region 44 of the amplifying transistor Tr3 and the drain region 44 of the selection transistor Tr4 are formed in common and shared with each other.

In addition, the high concentration region 26 of the floating diffusion (FD) region 20, the source region 41 of the reset transistor Tr2, and the amplifying gate electrode 46 of the amplifying transistor Tr3 are connected with each other via wiring 49. Moreover, the source region 47 of the selection transistor Tr4 and a vertical signal line 8 are connected via wiring 50.

According to the layout of the imaging section shown in FIG. 7, a large number of sharing pixels 32 are able to be arranged densely horizontally as well as vertically, whereby high-resolution solid-state imaging devices can be provided.

Figure 8:
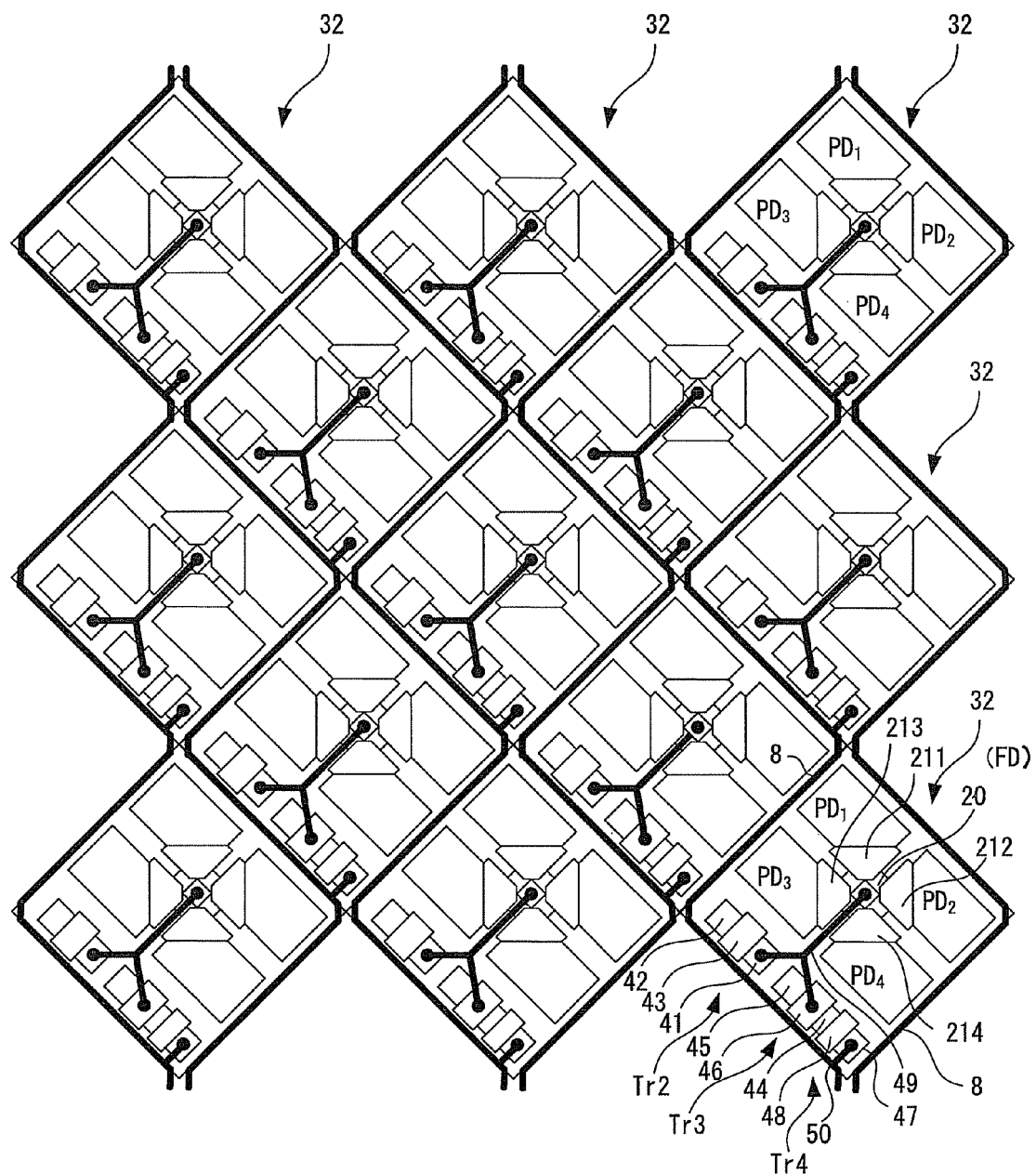
FIG. 8 is a plan view illustrating another example of a layout of the imaging section using the sharing pixel shown in FIG. 6.

FIG. 8 is a schematic view illustrating a further layout of the imaging section 3 using the sharing pixel 32 shown in FIG. 6 according to another example. This example illustrates the layout with a plurality of sharing pixels 32 arranged aslant (or in the honeycomb structure). That is, in this example, in a manner similar to the structure of FIG. 6, a set of reset transistor Tr2, amplifying transistor Tr3, and selection transistor Tr4 are arranged on one of the sides of respective sharing pixels 32 in the vertical direction, or on the bottom side in this example.

Such structures of the sharing pixels 32 are arranged horizontally and vertically as an orthogonal coordinate array with two orthogonal axes thereof inclined with respect to horizontal and vertical directions, respectively. In the example illustrated in FIG. 8, the sharing pixels 32 are arranged as an array on the orthogonal coordinate system with the two orthogonal axes inclined at 45 degrees with respect to horizontal and vertical directions, respectively.

Since other features of sharing pixel structure are similar to those described earlier with reference to FIG. 7, the portions similar to those in FIG. 7 are shown with identical representations and the description thereof is not repeated herewith.

According to the layout of the imaging section of FIG. 8, a large number of sharing pixels 32 are able to be densely arranged, whereby a solid-state imaging device can be provided having a resolution higher than the imaging section of FIG. 7.

Figure 9:
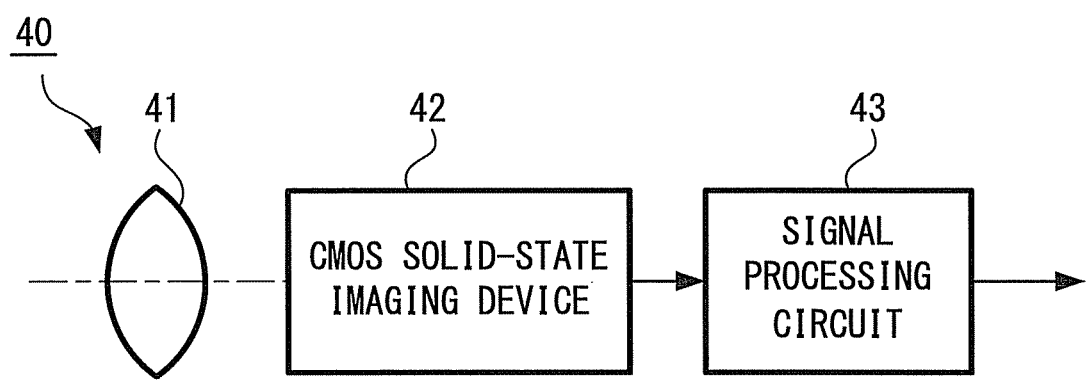
FIG. 9 is a view illustrating a configuration of a camera according to an embodiment of the present invention.

FIG. 9 is a schematic view illustrating the configuration of a camera including the abovementioned CMOS image sensors according to an embodiment of the present invention. Referring to FIG. 9, a camera 40 according to the present embodiment includes an optical system (optical lens) 41, a CMOS solid-state imaging device 42, and a signal processing circuit 43. As to the solid-state imaging device 42, any one of the pixel configurations described in the aforementioned first through third examples, and preferably one detailed in the first or third example with the device layout of either FIG. 7 or FIG. 8 may be used. The camera according to the present embodiment may also include a camera module formed by modularizing the optical system (optical lens) 41, the CMOS solid-state imaging device 42, and the signal processing circuit 43.

The optical system 41 is configured to carry out image formation on the imaging surface of the CMOS solid-state imaging device 42 with the image light (incident light) from the subject. Subsequently, the incident light is converted to signal charges in response to the amount of the incident light with photoelectric conversion element (light receiving unit) of CMOS solid-state imaging device 42, and the signal charges are accumulated for a fixed period of time in the photoelectric conversion element. The signal processing circuit 43 is configured to carry out a variety of signal processing on the signals output from CMOS solid-state imaging device 42, and to subsequently output resulted image signals.

With the camera according to an embodiment of the invention, the amount of saturation charges and conversion efficiency are maintained, and the transfer of signal charges to the floating diffusion region is improved even when pixel size is miniaturized, whereby high-resolution cameras can be provided.

According to an embodiment of the present invention, various electronic devices including the abovementioned camera shown in FIG. 9 or the camera module can be provided.

It should be understood by those skilled in the art that various modifications, combinations, sub-combinations and alterations may occur depending on design requirements and other factors insofar as they are within the scope of the appended claims or the equivalents thereof.

What is claimed is:
1. An imaging device, comprising:
a plurality of pixels, each of the pixels including photoelectric conversion regions, transfer transistors, a floating diffusion region, an amplification transistor, and a select transistor,
wherein each of the transfer transistors includes a gate electrode,
wherein the gate electrode has a first side facing at least one of the photoelectric conversion regions, a second side, a third side, and a fourth side,
wherein the second side extends parallel to a row direction,
wherein the third side extends parallel to a column direction,
wherein at least a part of the fourth side faces the floating diffusion region,
wherein the first side extends along a first direction different from the row direction and the column direction,
wherein a total length of the second side in addition to the third side and in addition to the fourth side is longer than a total length of the first side,
wherein the photoelectric conversion regions and the transfer transistors share the floating diffusion region, the amplification transistor, and the select transistor, and
wherein the amplification transistor and the select transistor are not arranged between photoelectric conversion regions that share the amplification transistor and the select transistor.
2. The imaging device according to claim 1,
wherein the fourth side that faces the floating diffusion region extends along a fourth direction that is different from the row direction and the column direction.
3. The imaging device according to claim 2, wherein the fourth direction is parallel to the first direction.
4. The imaging device according to claim 2, wherein the fourth side is shorter than the first side.
5. An imaging device, comprising:
a plurality of pixels, at least one of the pixels including a first photoelectric conversion region, a second photoelectric conversion region, a first transfer transistor, a second transfer transistor, a floating diffusion region, an amplification transistor, and a select transistor,
wherein the first photoelectric conversion region is adjacent to the second photoelectric conversion region in a column direction, wherein a gate electrode of the first transfer transistor is arranged between the first photoelectric conversion region and the floating diffusion region, wherein a gate electrode of the second transfer transistor is arranged between the second photoelectric conversion region and the floating diffusion region, wherein each of the gate electrodes of the first and second transfer transistors has a first side facing their respective photoelectric conversion region, a second side, a third side, and a fourth side, wherein the second side extends parallel to a row direction, wherein the third side extends parallel to a column direction, wherein at least a part of the fourth side faces the floating diffusion region, wherein the first side extends along a first direction that is different from the row direction and the column direction, wherein a total length of the second side in addition to the third side and in addition to the fourth side is longer than a total length of the first side, wherein the first and second transfer transistors share the floating diffusion region, the amplification transistor, and the select transistor, and wherein the amplification transistor and the select transistor are not arranged between photoelectric conversion regions that share the amplification transistor and the select transistor.

6. The imaging device according to claim 5, wherein the fourth side extends along a fourth direction that is different from the row direction and the column direction.

7. The imaging device according to claim 6, wherein the fourth direction is parallel to the first direction.

8. The imaging device according to claim 6, wherein the fourth side is shorter than the first side.

9. The imaging device according to claim 5, wherein the second side of the gate electrode of the first transfer transistor is facing the second side of the gate electrode of the second transfer transistor.

* * * * *